United States Patent [19]

Vandegraaf

[11] 4,262,264
[45] Apr. 14, 1981

[54] APPARATUS AND METHOD FOR ACHIEVING ACQUISITION AND MAINTAINING LOCK IN A PHASE LOCKED LOOP

[75] Inventor: Johannes J. Vandegraaf, Lynchburg, Va.

[73] Assignee: General Electric Company, Lynchburg, Va.

[21] Appl. No.: 12,878

[22] Filed: Feb. 16, 1979

[51] Int. Cl.³ ............................................. H03L 7/12
[52] U.S. Cl. ........................................ 331/4; 331/8; 331/14; 331/16; 331/17; 331/25
[58] Field of Search ..................... 331/4, 8, 12, 14, 16, 331/17, 18, 25

[56] References Cited

U.S. PATENT DOCUMENTS

| | | | |
|---|---|---|---|
| 2,896,169 | 7/1959 | Howell | 331/4 |
| 3,421,105 | 1/1969 | Taylor | 331/4 |
| 3,958,186 | 5/1976 | Jesse et al. | 331/4 |

OTHER PUBLICATIONS

Blanchard, "Phase Locked Loops", John Wiley and Sons, 1976, pp. 281-289.

Primary Examiner—Siegfried H. Grimm
Attorney, Agent, or Firm—James J. Williams

[57] ABSTRACT

A voltage controlled oscillator (VCO) and reference oscillator are connected in a phase locked loop with a first phase detector, loop switch, and acquisition sawtooth sweep circuit. A second phase detector and fast integrator circuit are connected to the VCO and reference oscillator in quadrature relation with respect to the first phase detector. As the acquisition sweep circuit sweeps the VCO, the fast integrator produces a signal whose magnitude increases as the swept VCO frequency approaches the frequency needed for the phase locked loop to achieve phase lock. When this signal magnitude exceeds a predetermined threshold, an output control signal is produced. This output control signal causes the loop switch to close and make the phase locked loop operational. A delay circuit is connected to the second phase detector and fast integrator. The delay circuit produces a delayed output at a predetermined time after the control signal is produced. The delayed output prevents the acquisition sweep circuit from further sweeping after the phase locked loop is operational. The delayed output can also be used to energize other apparatus, such as a radio transmitter. If the phase locked loop includes a mixer or divider which may produce an image or harmonic frequency that could cause erroneous phase lock, a complementary or inverted output can be derived from the second phase detector, and applied to a slow integrator. If the slow integrator output exceeds a predetermined threshold, it opens the loop switch and disables the phase locked loop. This permits the acquisition sweep circuit to operate until the proper frequency is acquired for proper operation by the phase locked loop.

23 Claims, 5 Drawing Figures

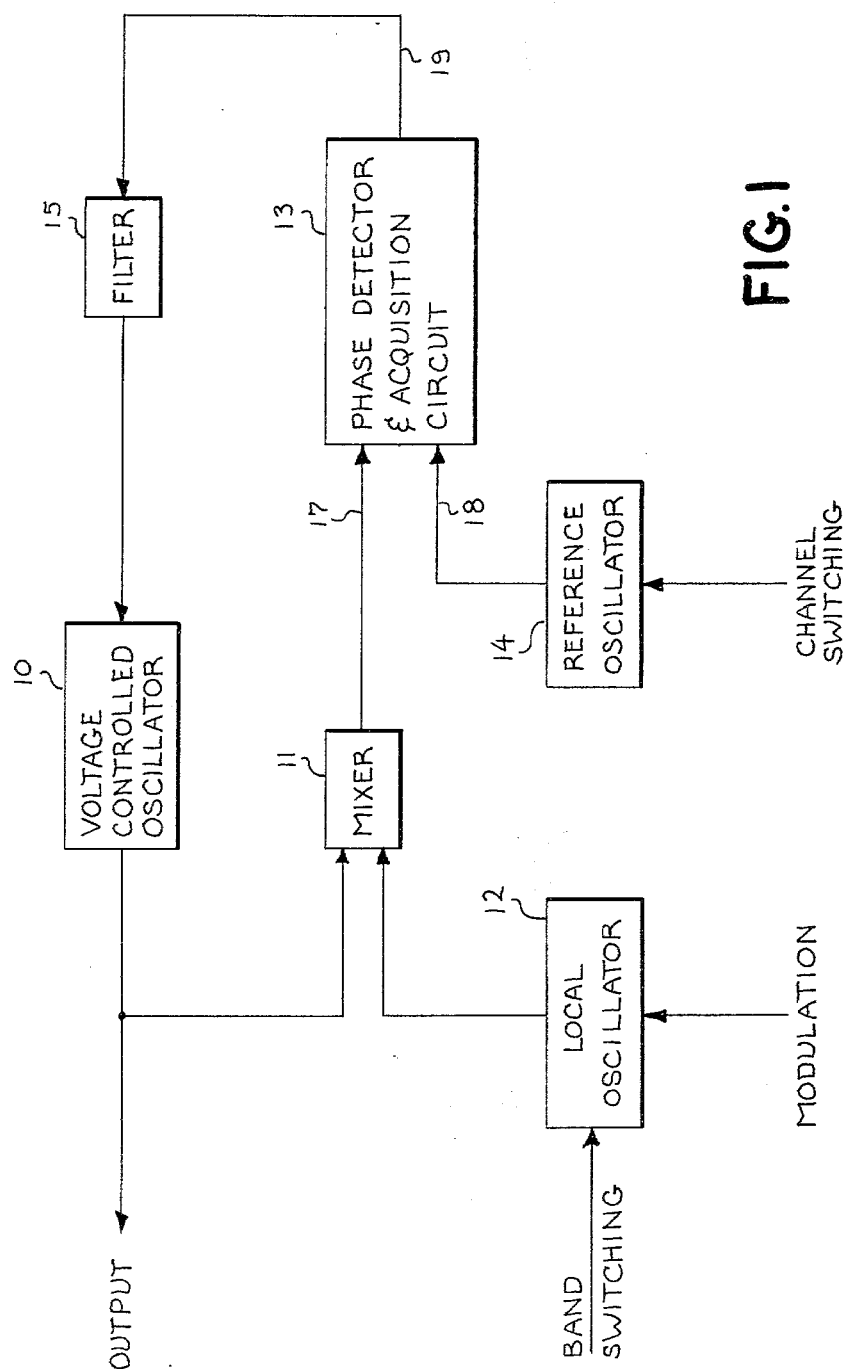

APPARATUS AND METHOD FOR ACHIEVING ACQUISITION AND MAINTAINING LOCK IN A PHASE LOCKED LOOP

BACKGROUND OF THE INVENTION

My invention relates to a phase locked loop, and particularly to an acquisition circuit for a phase locked loop, and method pertaining thereto.

Phase locked loops are used extensively in electronic and radio apparatus to provide a signal whose frequency can be easily varied and whose stability can be maintained by a reference oscillator.

Accordingly, a primary and general object of my invention is to provide a new and improved acquisition circuit for a phase locked loop.

Another object of my invention is to provide a new and improved acquisition circuit for a phase locked loop that can reliably acquire phase lock (sometimes called pull-in) over a relatively wide band of frequencies, and maintain that acquired phase lock.

While acquisition circuits have been previously provided for phase locked loops, such acquisition circuits have not been as simple and reliable in operation as the state of the art and present electronic and radio apparatus require.

Accordingly, another object of my invention is to provide a new and improved acquisition circuit for a phase locked loop that is relatively simple and reliable in achieving acquisition.

Another object of my invention is to provide a new acquisition circuit for a phase locked loop that can reliably sweep a voltage controlled oscillator (VCO) over a wide range of frequencies to achieve phase lock.

Another object of my invention is to provide a new and improved method for achieving and maintaining acquisition in a phase locked loop.

In some phase locked loops, a mixer is used in place of or in addition to a frequency divider or multiplier to cause the voltage controlled oscillator (VCO) to operate at the desired frequency relative to a local oscillator frequency. As the VCO is swept, it can produce a frequency which is the image of the desired frequency. (The image frequency is the frequency on one side of and separated from the local oscillator frequency by the same amount that the desired frequency is on the other side of and separated from the local oscillator frequency.) When the image frequency is produced, the mixer produces a frequency which appears correct to the phase locked loop, and causes the phase locked loop to try to lock on that incorrect image frequency. This results in an unstable condition. Or, because of the mixing or frequency dividing sometimes used in the phase locked loop, phase lock may incorrectly occur on a harmonic frequency.

Accordingly, another object of my invention is to provide a new and improved acquisition circuit which prevents a phase locked loop from locking or attempting to lock on the improper image or harmonic frequency.

In some applications where a phase locked loop is used, power consumption is quite important. This is particularly true of battery powered radio transmitter and receiver equipment, such as a hand-held personal transceiver.

Accordingly, another object of my invention is to provide a new and improved acquisition circuit for a phase locked loop which can operate relatively quickly when power is applied for transmitting and receiving.

Another object of my invention is to provide a new and improved acquisition circuit which has means for preventing a transmitter from operating until acquisition and phase lock are obtained.

Another object of my invention is to provide a new and improved acquisition circuit which has means for preventing acquisition sweep, with resultant radio frequency interference, if the acquisition circuit is operating improperly.

SUMMARY OF THE INVENTION

Briefly, these and other objects are achieved in accordance with my invention by a method or acquisition circuit that sweeps a voltage controlled oscillator (VCO) in a phase locked loop through the desired range of frequencies. During this sweep, when a first phase lock indication is produced, the acquisition circuit closes a loop switch in the phase locked loop to permit the phase locked loop to control the VCO frequency. Also, during this sweep, if a second complementary or inverted phase lock indication is produced, this means that the phase lock is within an image frequency. This second indication opens the loop switch and permits the VCO sweep to continue until the proper first phase lock indication is produced. The loop switch is then again closed to permit the phase locked loop to resume control. A delay circuit is provided to produce a delayed signal after the proper first phase lock indication is produced, so as to provide settling time for the control loop. If desired, the delayed signal can perform any other function such as keying or enabling a radio transmitter.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

FIG. 1 shows a phase locked loop provided with an acquisition circuit in accordance with my invention;

FIGS. 4-1 and 4-2 show waveforms illustrating the operation of my acquisition circuit.

DESCRIPTION OF THE PREFERRED EMBODIMENT

Background

Figures 1, 4:
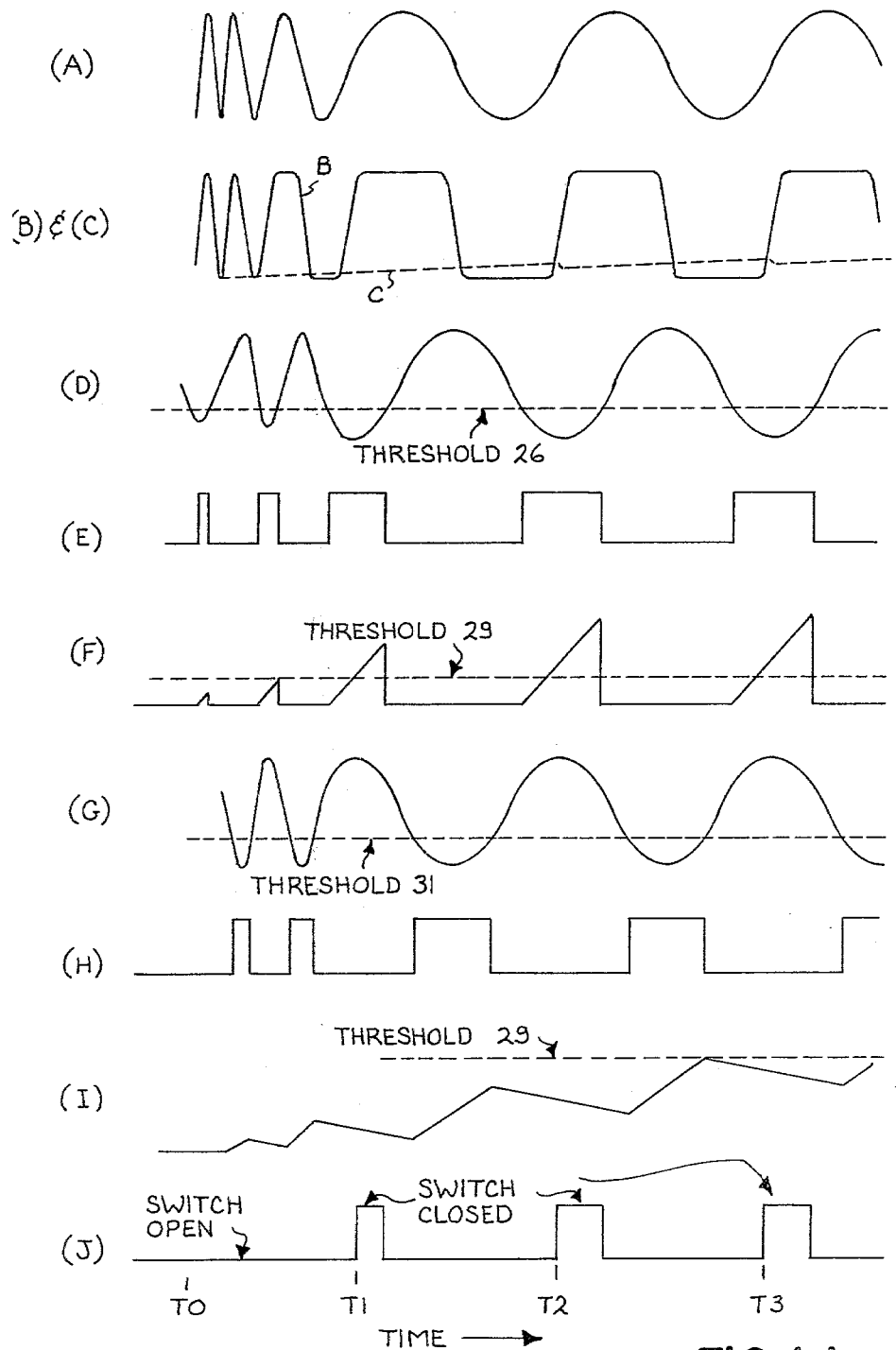
Figures 2, 4:
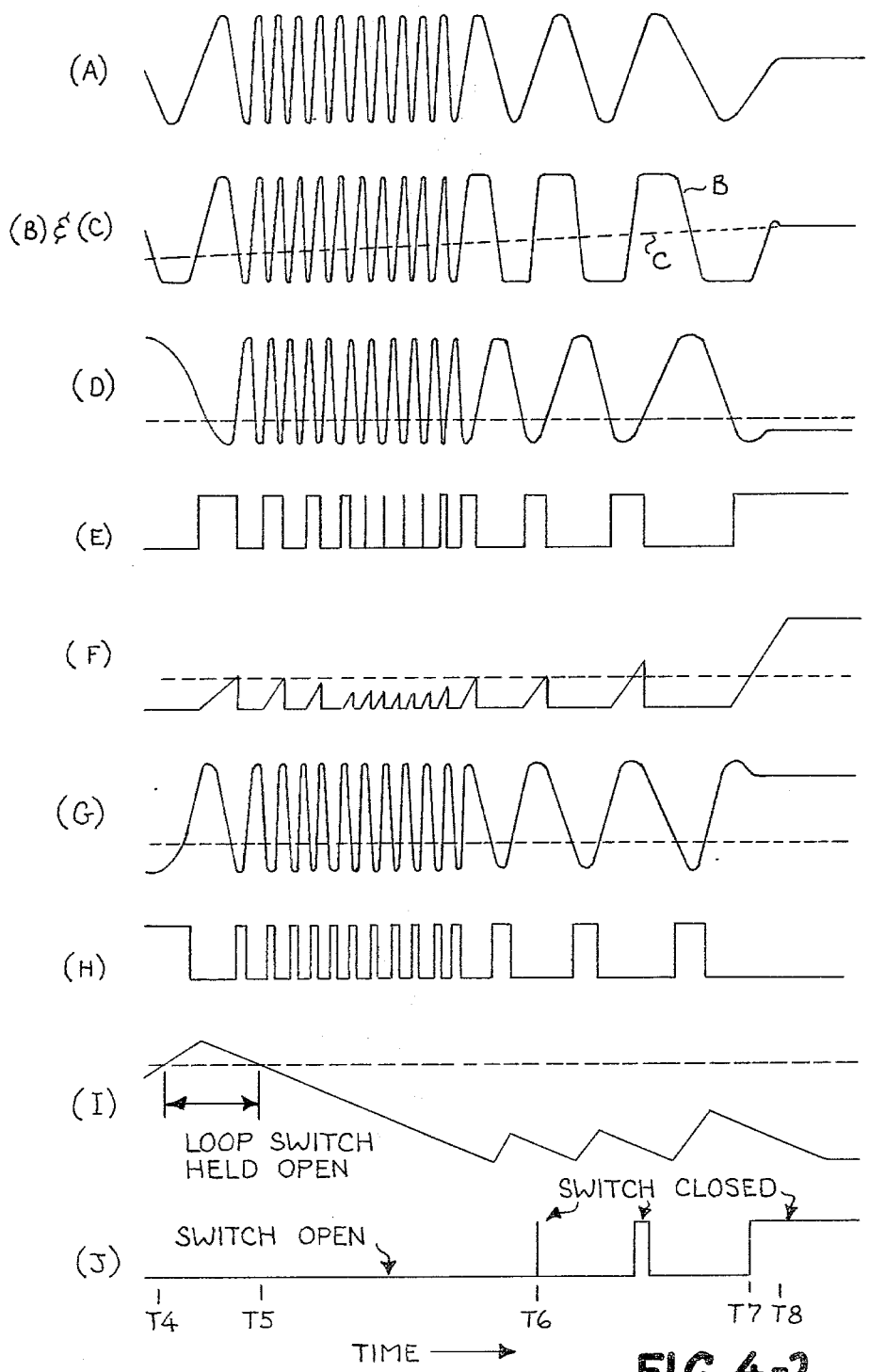

FIG. 1 shows a phase locked loop provided with an acquisition circuit in accordance with my invention. The phase locked loop comprises a voltage controlled oscillator (VCO) 10 whose output is utilized in any way desired, such as in a radio transmitter and receiver. This output is supplied to a mixer circuit 11 along with signals from a local oscillator 12, which may be modulated by intelligence or voice signals, and which may be switched to different frequency bands. The mixer circuit 11 is assumed to produce output signal frequencies representing the difference between the two applied signal frequencies, and this output is applied to an input 17 of a phase detector and acquisition circuit 13. Signals from a channel switching reference oscillator 14 are applied to another input 18 of the phase detector and acquisition circuit 13. The circuit 13 produces a voltage or signal at its output which is indicative of the relative phases of the two applied signals, and this signal or voltage is applied to a filter 15 to eliminate or reduce the higher frequency components. The filtered signal controls the frequency produced by the voltage controlled oscillator 10. Except for the acquisition circuit, the phase locked loop described thus far is known in the art. In a phase locked loop where a mixer circuit is used, or where harmonic signals may be present, the loop may attempt to lock on the incorrect frequency. Hence, it is very desirable, and in cases of possible radio frequency interference absolutely necessary, that the phase lock be on the proper frequency. An example will illustrate this.

In this example, I have assumed that the voltage controlled oscillator 10 is capable of being swept over a frequency range from 430 to 470 MHz. In some applications, such as battery powered equipment, power consumption is important. In such a case, the voltage controlled oscillator 10 must be swept over the assumed range from 430 to 470 MHz each time the equipment is operated and power is applied. Hence, the phase locked loop need not be kept on and operating at all times, and power is saved. The reference oscillator 14 operates at a frequency of approximately 15 MHz. The exact frequency is determined by the desired channel on a kilohertz basis, and hence not critical to this explanation. If the mixer 11 produces a difference frequency, the local oscillator 12 can operate over a frequency range from 415 to 455 MHz. With these assumptions, the following table can be provided:

| Some of the Voltage Controlled Oscillator 10 Frequencies During Sweep | Local Oscillator 12 Selected Frequency Band | Reference Oscillator 14 Frequency |
| --- | --- | --- |
| 430 MHz | 415 MHz | 15 MHz |
| 440 MHz | 425 MHz | 15 MHz |
| 450 MHz | 435 MHz | 15 MHz |
| 460 MHz | 445 MHz | 15 MHz |
| 470 MHz | 455 MHz | 15 MHz |

Suppose the desired voltage controlled oscillator frequency is 470 MHz. The local oscillator band would be switched to 455 MHz and the voltage controlled oscillator 10 swept from the low frequency to the high frequency. As the oscillator 10 sweeps, it produces a frequency of 440 MHz (which I call the undesired or image frequency). This frequency of 440 MHz and the 455 MHz produced by the local oscillator 12 cause the mixer 11 to produce a 15 MHz frequency. As far as the phase detector portion of the circuit 13 is concerned, this 15 MHz frequency (resulting from the improper image frequency) appears to be correct. The circuit 13 produces a signal that would, in the absence of my invention, cause the voltage controlled oscillator 10 to stop its sweep and continue to produce the improper image frequency of 440 MHz. However, the proper or true frequency needed from the voltage controlled oscillator 10 is 470 MHz. Numerous other incorrect possibilities of locking on the image frequency will be apparent from a study of the above table, whether the oscillator 10 is swept from high to low frequency, or low to high frequency as described. Hence, some arrangement is needed to distinguish between the improper or image frequency and between the proper or true frequency to prevent incorrect operation and lock. My acquisition circuit distinguishes between image and true frequencies, and provides proper operation and lock.

Circuit Description

Figure 2:
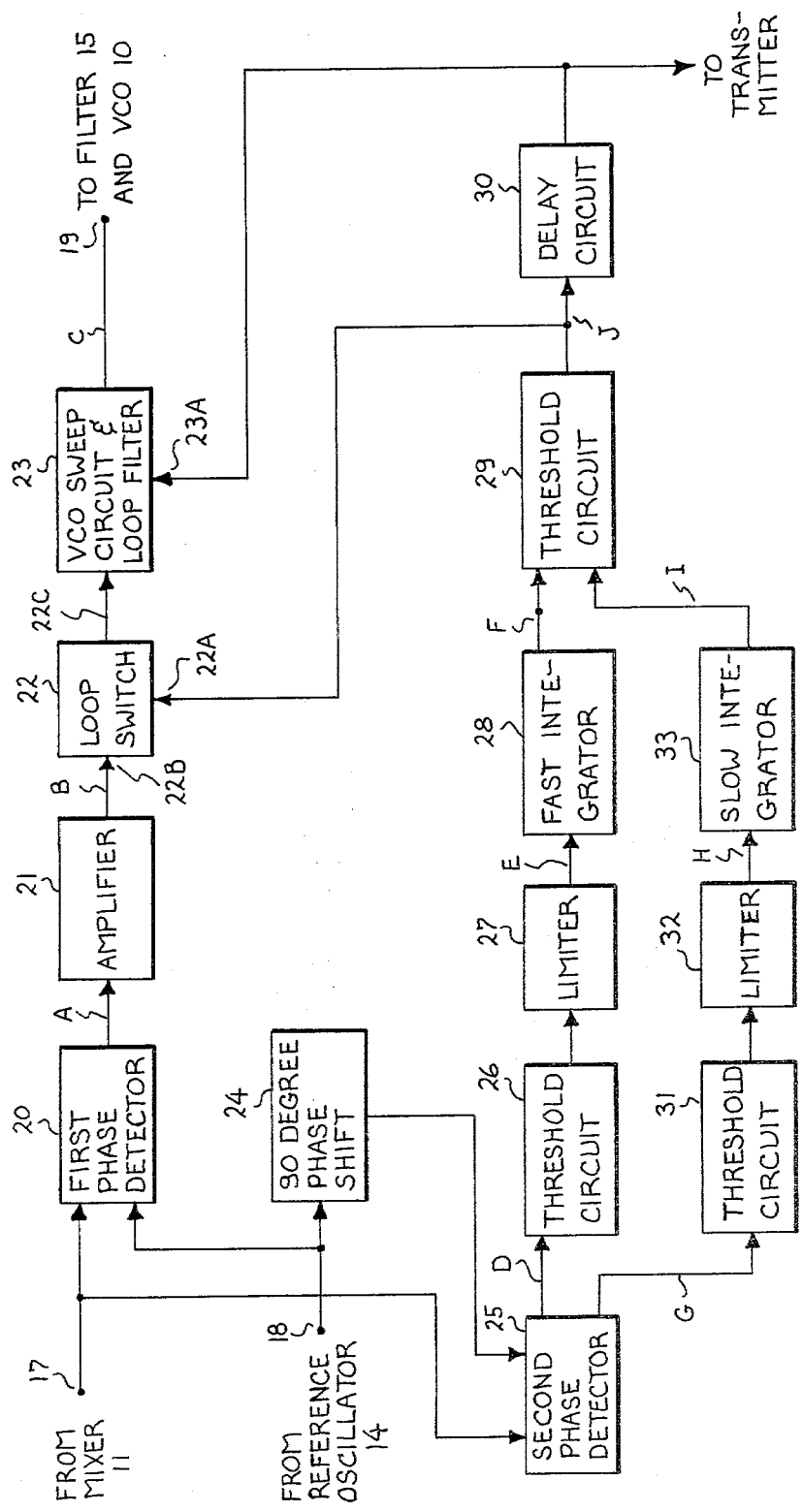
FIG. 2 shows a block diagram of a preferred embodiment of my acquisition circuit for use in a phase locked loop.

FIG. 2 shows a block diagram of a preferred embodiment of my acquisition circuit 13 for use in the phase locked loop of FIG. 1. Input signals from the mixer 11 are applied to the terminal 17, input signals from the reference oscillator 14 are applied to the terminal 18, and output signals from the circuit 13 are supplied at the terminal 19 for application to the filter 15 and the voltage controlled oscillator 10. The mixer signals are applied to a first phase detector 20 and to a second phase detector 25. Signals from the reference oscillator 14 are applied to the first phase detector 20 and to a quadrature or 90 degree phase shift circuit 24. The output from the phase shift circuit 24 is applied to the second phase detector 25. The purpose of the phase shift circuit 24 is to provide a quadrature relation for the signals applied to the first phase detector 20 and the second phase detector 25. The quadrature relation could be provided for the mixer signals instead of for the reference oscillator signals, or could be provided for the first phase detector 20 instead of the second phase detector 25.

The output of the first phase detector 20 is applied to an amplifier 21, and the amplified output is applied to an input terminal 22B of a loop switch 22. The loop switch output terminal 22C is connected to a search or sweep circuit 23 for the voltage controlled oscillator 10. The loop switch 22 passes signals from the amplifier 21 to the sweep circuit 23 as determined by a control signal applied to a control terminal 22A of the loop switch 22. The sweep circuit 23 normally produces a repetitive sawtooth sweep signal. This sawtooth sweep signal appears at terminal 19 to sweep the voltage controlled oscillator 10 over its desired range to make acquisition possible. This sawtooth sweep will be stopped and held at a voltage level determined by the output of amplifier 21 under the control of a signal applied to a terminal 23A. The phase lock system is then in a state of acquisition. That is, the frequencies of both inputs to the phase detector 20 are identical.

Two outputs having a complementary or inverse relation with respect to each other are derived from the second phase detector 25. The first or normal output is applied to a threshold circuit 26 and a limiter circuit 27 which pass phase detector signals that exceed the threshold level, and which limit the amplitude of those passed signals. The output of the limiter 27 is applied to a fast pulse integrator 28 having a relatively fast time constant. As the frequencies of the two signals (applied to the detector 25) approach each other, the integrated signals increase in amplitude. The output of the integrator 28 is applied to one input of an amplitude threshold circuit 29. The output of the threshold circuit 29 is connected to the control terminal 22A of the loop swtich 22. If the amplitude of the integrated signals from the fast integrator 28 exceeds the threshold, the threshold circuit 29 produces a signal which turns on or closes the loop switch 22. When closed, the switch 22 passes signals from the amplifier 21 to the sweep circuit and loop filter 23.

The second or complementary output of the second phase detector 25 is applied to a similar circuit, including a threshold circuit 31, an amplitude limiter 32, and a slow pulse integrator 33 having a relatively slow time constant. The output of the slow integrator 33 is applied to a second input of the threshold circuit 29. If the amplitude of the integrated signals from the slow integrator 33 exceeds the threshold, the threshold circuit 29 produces a signal which opens the loop switch 22 and prevents it from passing signals from the amplifier 21 to the sweep circuit 23, and the VCO 10.

The output of the threshold circuit 29 is also applied to a time delay circuit 30. The time delay circuit 30 introduces a short time delay (5 milliseconds for example) so that the control system has time to settle before a lock indication is given for other control purposes, such as to activate a transmitter. The output of the delay circuit 30 is also used to inhibit the sweep circuit 23 to insure that under no condition the VCO 10 can be swept when the loop is in a state of acquisition. This prevents possible radio frequency interference. The delay circuit is of a fast reset type, assuring that an out of lock indication will have negligible delay. When the threshold circuit 29 and the delay circuit 30 produce a blocking or open loop signal, the sweep circuit 23 is not affected. In this condition the sweep circuit voltage continues to change and permits the oscillator 10 frequency to continue being swept.

Figure 3:
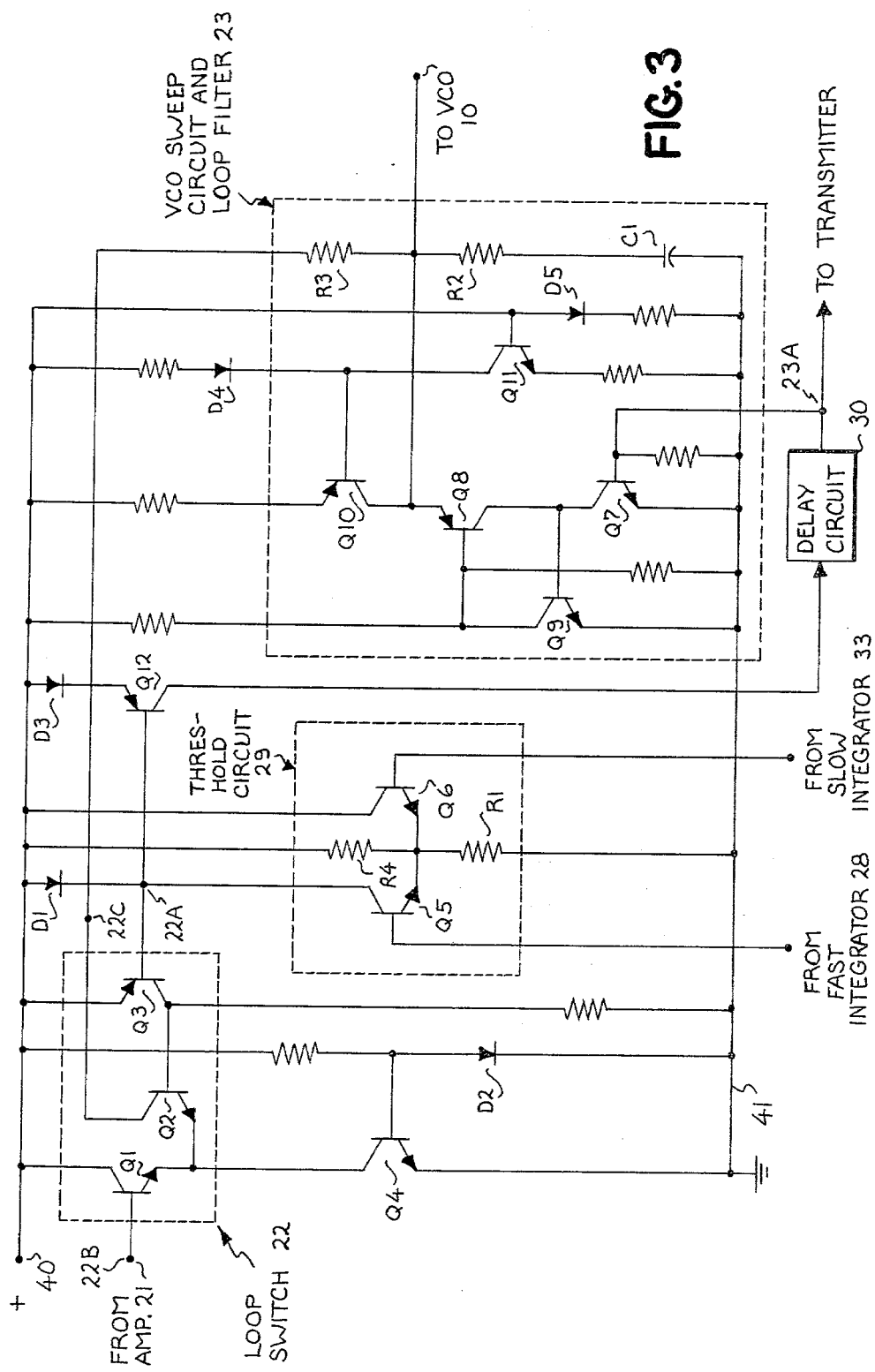
FIG. 3 shows a schematic diagram of portions of my acquisition circuit of FIG. 2.

Most of the circuits represented by the blocks in FIG. 2 are known in the art. Specifically, the phase detectors 20, 25, the amplifier 21, the quadrature or 90 degree phase shift circuit 24, the threshold circuits 26, 31, the limiters 27,32, the pulse integrators 28, 33, and the delay circuit 30 are known and familiar to persons skilled in the art, so that they will not be described. However, my loop switch 22, my voltage controlled oscillator sweep circuit 23, and my threshold circuit 29 are, either individually or collectively, novel. FIG. 3 shows a more detailed schematic diagram of these circuits or blocks.

Suitable direct current power is provided to the circuits by a positive terminal 40 and a ground or reference terminal 41. Signals from the amplifier 21 are applied to the input terminal 22B of the loop switch 22 (indicated by the dashed line rectangle) comprising transistors Q1, Q2, Q3. If the transistor Q3 is turned on by a low voltage signal applied to the control terminal 22A, the transistor Q2 conducts to close the switch 22 so that amplifier signals at the terminal 22B are passed by the transistor Q2 to the output terminal 22C connected to the sweep circuit 23. If the transistor Q2 is turned off (by the transistor Q3 being turned off), the switch 22 is opened and amplifier signals at the terminal 22B are prevented or blocked from reaching the output terminal 22C.

The threshold circuit 29 (in a dashed line rectangle) comprises two transistors Q5, Q6 whose emitters are connected to the junction of two voltage divider resistors R1, R4 as shown. The base of the transistor Q5 is connected to the fast integrator 28, and the base of the transistor Q6 is connected to the slow integrator 33. If signals supplied by the fast integrator 28 exceed the threshold level set by the resistors R1, R4, the transistor Q5 is turned on so that the terminal 22A voltage is lowered sufficiently to turn on the transistor Q3 which, in turn, turns on the transistor Q2 to close the switch 22 and pass amplifier signals to the loop filter terminal 19. If signals supplied by the slow integrator 33 exceed the threshold level set by the resistors R1, R4, the transistor Q6 is turned on and the transistor Q5 is turned off. This turns off the transistor Q3, which turns off the transistor Q2 to open the switch 22 and block the amplifier signals.

Signals present at the threshold circuit 29 output (terminal 22A) are also applied through a transistor Q12 to the delay circuit 30. The output of the delay circuit 30 is applied to a transistor Q7. A relatively low voltage (or close loop) signal produced by the threshold circuit 29 turns on or closes the loop switch transistor Q2. This same signal also turns on the transistor Q12 to provide a relatively high voltage signal at the collector of the transistor Q12. This signal is delayed by the circuit 30 and provided at the terminal 23A. When this signal appears at the terminal 23A, it turns the transistor Q7 on. Conduction by the transistor Q7 turns the transistor Q9 off, and this in turn prevents the transistor Q8 from conducting and discharging the sweep capacitor C1. This prevents the possibility of interference which could result if the sweep were continued with the loop closed. A relatively high voltage (or open loop) signal produced by the threshold circuit 29 turns off or opens the loop switch transistor Q2. This signal also turns off the transistor Q12. The collector of the transistor Q12 drops to a relatively low voltage which is not delayed and which is applied to the transistor Q7 to turn the transistor Q7 off. This will permit the transistor Q9 to conduct and discharge the sweep circuit capacitor C1 when the capacitor voltage reaches a sufficiently high magnitude.

The sweep circuit 23 (in a dashed line rectangle) includes a resistor R2 and the capacitor C1 connected between the terminal 19 and the ground terminal 41 which are part of the loop filter. If no relatively high voltage signal is present at the terminal 23A, the transistor Q7 is turned off. The capacitor C1 is charged by current provided by a transistor Q10 which is biased in a conductive condition by a circuit including a diode D4, a transistor Q11, and a diode D5. This charging current is applied through the resistor R2 to charge the capacitor C1. As the capacitor C1 is charged, a voltage will be reached at the terminal 19 which causes the transistor Q8 to conduct. Conduction of the transistor Q8 turns on the transistor Q9 which turns on the transistor Q8 in regenerative fashion to provide a low impedance path that rapidly discharges the capacitor C1. Once the voltage at the terminal 19 falls below a selected level, the transistor Q8 stops conducting and capacitor C1 begins to charge again. This relatively slow charging and rapid discharging of the capacitor C1 provides the acquisition sweep voltage in the circuit 13 of FIG. 1.

If the remainder of the circuit is ignored, the capacitor C1 would continue to charge and discharge as indicated in the preceding paragraph. However, the voltage controlled oscillator 10 is swept and produces a frequency that causes the phase detector 25 to produce a lower difference frequency which in turn causes the fast integrator 28 to produce an increased output. If the fast integrator 28 output exceeds the threshold set by the resistors R1, R4, the transistor Q5 is turned on to produce a loop switch closing signal. The closing signal causes the transistor Q3 and the transistor Q2 to be turned on, so that the capacitor C1 charging current supplied by the transistor Q10 is diverted by the low impedance path comprising a resistor R3 and the transistors Q2 and Q4. This closing signal (after delay by the circuit 30) also prevents the transistor Q9 from being turned on and disables the sweep circuit. The result is that the voltage present at the terminal 19 is now controlled by the output of amplifier 21 via the loop switch 22 and the resistor R3. This fixed voltage is the level at which acquisition will be maintained by the closed loop feedback.

Circuit Operation

FIGS. 4-1 and 4-2 show wave forms, plotted along a common time axis, illustrating the operation of my acquisition circuit with respect to FIG. 2. FIGS. 4-1 and 4-2 should be considered together, with the right hand edge of FIG. 4-1 coinciding with the left hand edge of FIG. 4-2. The FIGS. 4-1 and 4-2 show wave forms A through J. These wave form designations represent the voltages or signals at the correspondingly lettered locations in FIG. 2. Wave form A shows the output of the first phase detector 20; solid line wave form B shows the output of the amplifier 21; dashed line wave form C shows the output of the VCO sweep circuit 23; wave form D shows the first output of the second phase detector 25; wave form E shows the current pulses supplied to the fast integrator 28; wave form F shows the output of the fast integrator 28; wave form G shows the second output of the second phase detector 25; wave form H shows the current pulses supplied to the slow integrator 33; wave form I shows the output of the slow integrator 33; and wave form J shows when closing and opening signals are applied to the loop switch 22. In the wave forms, I have assumed that the voltage controlled oscillator 10 sweeps through a relatively wide band of frequencies as assumed in the table given above, and that during this sweep, an incorrect or improper image frequency is first produced, and that subsequently the correct or true frequency is produced.

When the acquisition circuit is turned on at the time T0, the first phase detector 20 begins to produce an output whose frequency decreases as the frequency of the controlled oscillator signal approaches the frequency of the reference oscillator signal as shown in wave form A. After being amplified and limited, this signal has the appearance of the solid line wave form B. At the same time, the first and second outputs of the second phase detector 25 have a decreasing frequency as shown in the wave forms D and G respectively. In wave forms D and G, it will be noted that the two wave forms are complementary with respect to each other, and that both wave forms have a 90 degree or quadrature relationship with the wave form A. Current pulses (wave form E) supplied to the fast integrator 28 begin to increase in duration as the wave form D exceeds (in a negative direction) the threshold of the circuit 26. Current pulses (wave form H) supplied to the slow integrator 33 also begin to increase in duration as the wave form G exceeds (in a negative direction) the threshold of the circuit 31. The fast integrator 28 produces integrated pulses shown in the wave form F, and when they exceed the threshold of the circuit 29 shown by the dashed line, they close the loop switch 22 as shown by the pulses in wave form J at the times T1, T2, and T3.

Without my acquisition circuit, the pulses in wave form E supplied to the fast integrator 28 would acquire sufficient time duration from the image frequency to close the loop switch 22. This would cause incorrect phase lock. Or it could cause unstable operation. However, the slow integrator output shown in wave form I continues to rise and at the time T4, exceeds the threshold of the circuit 29 indicated by the dashed line. When this threshold is exceeded, the threshold circuit 29 produces an open loop switch signal which holds the loop switch 22 open, and permits the sweep circuit 23 to continue its sweep as shown in the dashed line of wave form C. As this sweep continues, the voltage controlled oscillator 10 passes the image frequency, so that the phase detectors 20, 25 again begin to produce a high frequency output as shown in the wave forms A and G around the time T5. Because of these relatively high frequency outputs, reduced current pulses (wave form H) are provided to the slow integrator 33. The integrator 33 output decreases and at the time T5, falls below the threshold of the circuit 29 as shown in wave form I. After the time T5, the sweep continues and the fast integrator 28 produces pulses (wave form F) which begin to exceed the threshold of the circuit 29 at about the time T6. These pulses cause the loop switch 22 to momentarily close several times. At about the time T7, the true frequency is being produced by the voltage controlled oscillator 10, so that the first output (wave form D) of the second phase detector 25 exceeds (in a negative direction) the threshold of the circuit 26. The fast integrator 28 output (wave form F) increases and exceeds the thresold of the circuit 29 to close the loop switch 22. At this time, phase detector signals from the first phase detector 20 are superimposed on the sweep signals in the circuit 23, and provide proper phase lock. Proper phase lock for acquisition occurs at the time T8. At the time T8, it will be noted that the second output of the second phase detector 25 shown in the wave form G does not exceed the threshold, so that the output of the slow integrator 33 continues to decay or drop and no longer be effective. This is why the complementary outputs of the second phase detector 25 are needed.

At the improper or image frequency, the complementary relation of these two wave forms D and G permits the slow integrator to predominate or control so that the threshold circuit keeps the loop switch 22 open. However, when the true or proper frequency is acquired, the loop switch is closed, and the slow integrator output is precluded or blocked from having an effect or control on the threshold circuit 29.

Conclusion

It will thus be seen that I have provided a new and improved acquisition circuit and method for controlling a voltage controlled oscillator and acquiring acquisition of a conventional phase lock loop. While I have shown only one embodiment of my invention, persons skilled in the art will appreciate the modifications which may be made. For example, various circuits, of known types, may be used in the blocks shown in FIGS. 1 and 2, and other circuit arrangements can be used in place of those specifically shown in FIG. 3, and described in FIGS. 4-1 and 4-2. Therefore, while my invention has been described with reference to a particular embodiment, it is to be understood that modifications may be made without departing from the spirit of the invention or from the scope of the claims.

What I claim as new and desire to secure by Letters Patent of the United States is:

1. In a phase locked loop having a first terminal for signals whose frequency is to be controlled, a second terminal for signals whose frequency is a reference, and a third terminal for control signals, an improved acquisition circuit comprising:

a. a first phase detector having input terminals connected to said first and second terminals;

b. a loop switch and a sweep generator connected in series between the output of said first phase detector and said third terminal;

c. a second phase detector having input terminals connected to said first and second terminals and having first and second output terminals for providing complementary output signals;

d. one input of one of said first and second phase detectors having a quadrature relation to the other inputs of said first and second phase detectors;

e. a first summing circuit connected to said first output terminal of said second phase detector for producing first summing signals whose amplitude varies as a function of the first output of said second phase detector;

f. a second summing circuit connected to said second output terminal of said second phase detector for producing second summing signals whose amplitude varies as a function of the second output of said second phase detector;

g. and a threshold circuit having first and second inputs connected to said first and second summing circuits respectively and having an output connected to said loop switch, said threshold circuit closing said loop switch in response to a predetermined amplitude of said first summing signals and opening said loop switch in response to a predetermined amplitude of said second summing signals.

2. The improved acquisition circuit of claim 1 and further comprising a delay circuit connected between said threshold circuit output and said sweep generator for inhibiting further sweeping of said sweep generator in response to a predetermined amplitude of said first summing signals.

3. The improved acquisition circuit of claim 1 or claim 2 wherein said loop switch is connected between said output of said first phase detector and said sweep generator.

4. The improved acquisition circuit of claim 1 or claim 2 wherein the time constant of said first summing circuit is faster than the time constant of said second summing circuit.

5. The improved acquisition circuit of claim 3 wherein the time constant of said first summing circuit is faster than the time constant of said second summing circuit.

6. An improved acquisition circuit for a phase locked loop comprising:

a. first means for providing a repetitive sweep signal for causing a voltage controlled oscillator to sweep over a relatively wide band of frequencies;

b. a first phase detector for providing a first phase signal indicative of the relative frequencies of signals produced by said voltage controlled oscillator and signals produced by a reference circuit;

c. second means for selectively superimposing said first phase signal on said sweep signal;

d. a second phase detector for providing first and second complementary signals indicative of the relative frequencies of signals produced by said voltage controlled oscillator and signals produced by said reference circuit, one of said signals applied to one of said phase detectors having a quadrature relation to said one signal applied to the other of said phase detectors;

e. threshold means connected to said second phase detector for producing a closed loop signal in response to said first complementary signal and producing an open loop signal in response to said second complementary signal;

f. and means connecting said threshold means to said second means for superimposing said first phase signals on said sweep signal in response to said closed loop signal and for preventing said first phase signals from being superimposed on said sweep signal in response to said open loop signal.

7. The improved acquisition circuit of claim 6, and further comprising a circuit connected to said threshold means and to said first means for disabling said first means in response to said closed loop signal.

8. The improved acquisition circuit of claim 6 or claim 7 wherein said connection between said threshold means and said second phase detector causes said closed loop signal to be produced more rapidly than said open loop signal.

9. The improved acquisition circuit of claim 7 wherein said circuit for disabling provides a time delay to said closed loop signal.

10. A circuit for achieving relatively wideband acquisition in a phase locked loop having a first phase detector with a limited frequency pull-in range for a voltage controlled oscillator signal and a reference signal, comprising:

a. first means including a second phase detector and integrator circuits for producing first and second signals in complementary relation with respect to each other and in quadrature with respect to signals produced by said first phase detector; said first complementary signal increasing in magnitude relatively rapidly in response to said voltage controlled oscillator signal frequency approaching a desired true frequency and in response to said voltage controlled oscillator signal frequency approaching an undesired image frequency; and said second complementary signal increasing in magnitude relatively slowly in response to said voltage controlled oscillator signal frequency approaching said undesired image frequency and in response to said voltage controlled oscillator signal frequency approaching said desired true frequency;

b. and threshold means connected to said first means for producing a first output signal for application to said phase locked loop to render said phase locked loop operative in response to said first complementary signal being greater than a first selected threshold and said second complementary signal being less than a second selected threshold, and for producing a second output signal for application to said phase locked loop to render said phase locked loop inoperative in response to said second complementary signal being greater than said second selected threshold.

11. The circuit of claim 10 wherein said first and second selected thresholds are substantially equal.

12. The circuit of claim 10 or 11 and further comprising means for supplying a sweep voltage to said phase locked loop, and means for holding said sweep voltage in response to said first output signal.

13. The circuit of claim 12 wherein said holding means presents a predetermined time delay to said first output signal.

14. A method for achieving acquisition in a phase locked loop comprising the steps of:

a. generating a first signal indicative of the relative phase of a controlled oscillator signal and a reference signal;

b. superimposing said first signal through a loop switch on an acquisition signal produced by a sweep circuit;

c. generating, in quadrature relation to said first signal, second and third complementary related signals indicative of the relative phase of said controlled oscillator signal and said reference signal;

d. generating fourth and fifth integrated signals in response to said second and third signals respectively;

e. comparing said fourth and fifth integrated signals against a threshold reference and closing said loop switch in response to said fourth signal exceeding said threshold reference, and said fifth signal being less than said threshold reference; and opening said loop switch in response to said fifth signal exceeding said threshold reference;

f. and holding said acquisition signal level in response to said fourth signal.

15. An improved phase locked loop and acquisition circuit therefor comprising:

a. a voltage controlled oscillator having an input and an output;

b. a reference oscillator;

c. a first phase detector having an input connected to said voltage controlled oscillator output and an input connected to said reference oscillator for producing first phase indicative signals;

d. a loop switch having an input connected to said first phase detector, having an output, and having a control input for opening and closing said switch;

e. a sweep generator connected between said loop switch output and said voltage controlled oscillator input for supplying sweep signals to control the frequency of said voltage controlled oscillator;

f. a second phase detector having an input connected to said voltage controlled oscillator output and an input connected to said reference oscillator, said second phase detector producing second phase indicative signals in complementary relation at first and second outputs respectively;

g. means for providing a quadrature phase shift to the oscillator signals applied to one of said phase detector inputs;

h. a first integrator connected to said first output of said second phase detector for producing first output signals having an amplitude that varies as a function of the signals at said first output of said second phase detector;

i. a second integrator circuit connected to said second output of said second phase detector for producing second output signals having an output that varies as a function of the signals at said second output of said second phase detector;

j. a threshold circuit connected to said first and second integrator circuits for producing a close signal in response to said first output signals of said first integrator circuit exceeding a predetermined magnitude, and for producing an open signal in response to said second output signals of said second integrator circuit exceeding a predetermined magnitude;

k. and means connecting said threshold circuit to said control input of said loop switch for closing said loop switch and superimposing said first phase indicative signals on said sweep generator signals in response to said close signal from said threshold circuit, and for opening said loop switch in response to said open signal from said threshold circuit.

16. The improved circuit of claim 15 and further comprising a circuit connected between said threshold circuit and said sweep generator for preventing further sweep signals in response to said close signal.

17. The improved circuit of claim 15 or claim 16 wherein the time constant of said second integrator circuit is slower than the time constant of said first integrator circuit.

18. The improved circuit of claim 15 or claim 16 and further comprising a mixer circuit connected between said voltage controlled oscillator and said first phase detector, and a local oscillator connected to said mixer.

19. The improved circuit of claim 17 and further comprising a mixer circuit connected between said voltage controlled oscillator and said first phase detector, and a local oscillator connected to said mixer.

20. The improved circuit of claim 15 or claim 16 wherein said threshold circuit blocks said close signal in response to the presence of said open signal.

21. The improved circuit of claim 17 wherein said threshold circuit blocks said close signal in response to the presence of said open signal.

22. The improved circuit of claim 18 wherein said threshold circuit blocks said close signal in response to the presence of said open signal.

23. The improved circuit of claim 19 wherein said thresold circuit blocks said close signal in response to the presence of said open signal.

* * * * *